(12) United States Patent
Wegmann et al.

(10) Patent No.: US 7,623,218 B2
(45) Date of Patent: Nov. 24, 2009

(54) METHOD OF MANUFACTURING A MINIATURIZED DEVICE

(75) Inventors: Ulrich Wegmann, Koenigsbronn (DE); Helmut Haidner, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 312 days.

(21) Appl. No.: 11/282,154

(22) Filed: Nov. 18, 2005

(65) Prior Publication Data
US 2006/0139583 A1 Jun. 29, 2006

Related U.S. Application Data

(60) Provisional application No. 60/630,248, filed on Nov. 24, 2004.

(51) Int. Cl.
*G03B 27/52* (2006.01)
*G03B 27/42* (2006.01)

(52) U.S. Cl. .......................... 355/30; 355/53

(58) Field of Classification Search ............. 355/18, 355/30, 53, 55, 57, 72; 356/445, 237.1, 361; 430/311
See application file for complete search history.

(56) References Cited

U.S. PATENT DOCUMENTS

| | | | |
|---|---|---|---|
| 5,121,256 A | | 6/1992 | Corle et al. |
| 5,610,683 A | | 3/1997 | Takahashi |
| 6,130,439 A | * | 10/2000 | Le Menn .................... 250/573 |
| 2005/0024609 A1 | * | 2/2005 | De Smit et al. ............... 355/18 |
| 2005/0046813 A1 | * | 3/2005 | Streefkerk et al. ............ 355/30 |
| 2005/0179877 A1 | * | 8/2005 | Mulkens et al. .............. 355/30 |
| 2007/0105050 A1 | * | 5/2007 | Jahromi et al. .............. 430/311 |

FOREIGN PATENT DOCUMENTS

| | | |
|---|---|---|
| EP | 1 416 246 A2 | 5/2004 |
| JP | 2000058436 A | 2/2000 |
| JP | 2001074605 A | 3/2001 |
| JP | 2001324414 A | 11/2001 |
| JP | 2002071513 A | 3/2002 |
| JP | 2002365554 A | 12/2002 |
| WO | WO 99/49504 A1 | 9/1999 |
| WO | WO 2004/023115 A1 | 3/2004 |
| WO | WO 2004/033988 A1 | 4/2004 |

* cited by examiner

*Primary Examiner*—Peter B Kim
(74) *Attorney, Agent, or Firm*—Townsend and Townsend and Crew LLP

(57) ABSTRACT

A method of manufacturing a miniaturized device comprises disposing a patterning structure to be imaged in a region of an object plane of an imaging optics of the projection exposure system; disposing a substrate carrying a resist in a region of an image plane of the imaging optics and exposing portions of the substrate with images of the patterning structure using the projection exposure system; maintaining a flow of an immersion liquid to and from a space between the substrate and a front lens of the imaging optics closest to the substrate; measuring a physical property which is indicative of at least one of a refractive index of the immersion liquid and a change of the refractive index of the immersion liquid over time, wherein the physical property is measured using a beam of measuring light interacting with the immersion liquid; adjusting at least one optical property of the projection exposure system based on the measured physical property; exposing further portions of the substrate with images of the patterning structure using the projection exposure system with the at least one adjusted optical property of the projection exposure system; and developing the exposed resist and processing the substrate with the developed resist.

21 Claims, 5 Drawing Sheets

METHOD OF MANUFACTURING A MINIATURIZED DEVICE

BACKGROUND OF THE INVENTION

1. Field of the Invention

The present invention relates to a method of manufacturing miniaturized devices. In particular, the invention relates to a lithographic method of manufacturing miniaturized devices using a projection exposure system of the liquid immersion type.

2. Brief Description of Related Art

Lithographic processes are commonly used in the manufacture of miniaturized structures such as integrated circuits, liquid crystal elements, micro-patterned structures and micro-mechanical components.

A projection exposure apparatus used for photolithography generally comprises a projection optical system for imaging a patterning structure, commonly referred to as a reticle, onto a substrate, commonly referred to as a wafer. The substrate (wafer) is coated with a photo-sensitive layer, commonly referred to as a resist, which is exposed with the image of the patterning structure using imaging light. The imaging light is generated by an illumination optical system illuminating the patterning structure.

The trend to produce even smaller and more sophisticated miniaturized devices places increasingly high demands on an optical resolution which is achievable with the imaging of the projection exposure system. Conventional projection exposure systems have been designed in view of increasing a numerical aperture of the imaging on a side of the exposed substrate. Increasing the numerical aperture while maintaining the optical performance of the system at a desired level results in that the projection exposure system has an increased number of optical elements with an increased diameter. The efforts to manufacture such projection optical system are significantly increased with increasing numerical aperture.

Recently liquid immersion-type projection exposure systems have been proposed. In such immersion-type projection exposure system, an immersion liquid is disposed in a space between the substrate to be exposed and a front lens of the system disposed closest to the substrate. With such immersion liquid an achievable resolution is significantly higher than in a comparable system having a gas rather than the immersion liquid disposed in the space between the substrate and the front lens.

A design and manufacture of projection optical systems of the immersion-type suffers from a lack of experience with such technology. Among others, a behavior of the immersion liquid is not sufficiently well understood and analyzed at present.

The optical properties of the immersion liquid and in particular its refractive index have to conform with a predefined value used in the design of the system. It is understood that the optical properties of the immersion liquid have to be controlled to a high accuracy during the exposure process.

SUMMARY OF THE INVENTION

In view of the above, it is an object of the present invention to provide a method of manufacturing a miniaturized device using a projection exposure system of the liquid immersion type allowing to achieve and maintain a high imaging quality during the manufacturing process.

It is a further object of the present invention to provide an apparatus suitable for measuring a refractive index of an immersion liquid.

According to an exemplary aspect of the present invention, a method of manufacturing a miniaturized device comprises: disposing a patterning structure to be imaged in a region of an object plane of an imaging optics of the projection exposure system; disposing a substrate carrying a resist in a region of an image plane of the imaging optics and exposing portions of the substrate with images of the patterning structure using the projection exposure system; maintaining, at least during selected time intervals, a flow of an immersion liquid to and from a space between the substrate and a front lens of the imaging optics closest to the substrate; measuring a first physical property which is indicative of at least one of a second physical property of the immersion liquid and a change of the second physical property of the immersion liquid over time; adjusting at least one optical property of the projection exposure system based on the measured first physical property; exposing further portions of the substrate with images of the patterning structure using the projection exposure system with the at least one adjusted optical property of the projection exposure system; and developing the exposed resist and processing the substrate with the developed resist.

According to a further exemplary aspect of the present invention, a method of manufacturing a miniaturized device comprises: disposing a patterning structure to be imaged in a region of an object plane of an imaging optics of the projection exposure system; disposing a substrate carrying a resist in a region of an image plane of the imaging optics and exposing portions of the substrate with images of the patterning structure using the projection exposure system; maintaining a flow of an immersion liquid to and from a space between the substrate and a front lens of the imaging optics closest to the substrate; measuring a physical property which is indicative of at least one of a refractive index of the immersion liquid and a change of the refractive index of the immersion liquid over time, wherein the physical property is measured using a beam of measuring light interacting with the immersion liquid; adjusting at least one optical property of the projection exposure system based on the measured physical property; and exposing further portions of the substrate with images of the patterning structure using the projection exposure system with the at least one adjusted optical property of the projection exposure system.

The inventors have found that the immersion liquid, participating in the imaging of the patterning structure, provides an optical element which determines an optical quality of the imaging together with other optical elements, such as lenses and mirrors, of the projection exposure system. All optical elements have a combined effect on the imaging quality, and a deviation of one optical element from its desired specification may be compensated for by adjusting an optical property of some other optical element. Therefore, the inventors found that the refractive index of the immersion liquid is an optical parameter not only of the space between the front lens and the substrate but also of the whole projection exposure system.

According to an exemplary embodiment of the present invention, the refractive index of the immersion liquid or some other physical property which is indicative of the refractive index is measured, and at least one optical property of the projection exposure system is adjusted in dependence of a corresponding measuring result. Herein, the measuring of the refractive index of the immersion liquid should not be limited to measuring an absolute value of the refractive index but also to measuring relative changes of the refractive index of the immersion liquid, such as relative changes of the refractive index over time. The term front lens as used herein comprises any element within the beam path of the imaging optics and having a front surface opposite to a surface of the substrate and confining the immersion liquid. The front surface of the front lens may have a shape such as a flat shape, a concave shape and a convex shape, a spherical shape and an aspherical shape. Also the other surface of the front lens may have a shape such as flat shape, a concave shape and a convex shape, a spherical shape and an aspherical shape. In particular, the front lens may also comprise a plate having two flat surfaces.

According to an exemplary embodiment of the invention, the physical property which is indicative of the refractive index is measured using a beam of measuring light interacting with the immersion liquid. The beam of measuring light may interact with the immersion liquid at a location upstream of the space between the substrate and the front lens, the beam may interact with the immersion liquid within the space between the substrate and the front lens, and the beam may interact with the immersion liquid at a location downstream of the space between the substrate and the front lens. According to a particular embodiment, the beam of measuring light interacts with the immersion liquid at plural locations upstream and downstream and within the space between the substrate and the front lens.

According to an exemplary embodiment of the invention, the at least one optical property which is adjusted in dependence of the measuring result is a relative position, such as a relative distance and a relative orientation, between two optical elements of the projection exposure system relative to each other. Such relative position may be adjusted with a goal of achieving a higher quality of the imaging of the patterning structure onto the substrate.

According to a further exemplary embodiment of the invention, the at least one optical property which is adjusted in dependence of the measuring result is the refractive index of the immersion liquid disposed in the space between the substrate and the front lens. The adjusting of the refractive index of the immersion liquid may comprise adjusting a temperature of the immersion liquid supplied to the space between the substrate and the front lens. This is based on the understanding that the refractive index of the immersion liquid is a function of its temperature.

According to a further exemplary embodiment of the invention, the immersion liquid is composed of plural components, and the refractive index of the immersion liquid is adjusted by adjusting relative amounts of the components of the immersion liquid. An example of an immersion liquid having plural components is a liquid system composed of different grades of an oil marketed under the trade name Fomblin by Solvay Solexis, Inc., New York, USA. This oil is a perfluoropolyether available in different grades having molecules of different chain length and different refracting index, accordingly.

An example of an immersion liquid consisting substantially of only one single component is pure (deionized) water.

According to a further exemplary embodiment of the invention, the at least one optical property which is adjusted in dependence of the measuring result is a shape of a surface of an optical element of the projection exposure system. The optical element may comprise a mirror or a lens, wherein at least one actuator, such as a piezoelectric element, is provided for changing the shape of the surface of the optical element by applying a mechanical force, such as a blending force, to the optical element.

According to an exemplary embodiment, the immersion liquid is supplied through a tube forming a portion of a measuring optics traversed by the beam of measuring light. According to an exemplary embodiment herein, a reference pattern traversed by the beam of measuring light is disposed in an object plane of the measuring optics, and a projected pattern generated from the reference pattern by the beam of measuring light downstream of the measuring optics is analyzed for determining the at least one physical property which is indicative of the refractive index of the immersion liquid traversed by the beam of measuring light. Such measuring arrangement provides a high accuracy of determining the above mentioned physical property.

The analyzing of the projected pattern may comprise superimposing the projected pattern with an analyzing pattern and analyzing the superimposed pattern. The analyzing pattern may substantially conform to the projected pattern, wherein the analyzing pattern is slightly displaced relative to the projected pattern such that the superimposed pattern is a Moiré pattern which may be readily analyzed while achieving a highly accurate measuring result.

According to a further exemplary embodiment, the determining of the physical property comprises an interferometric method of generating an interference pattern by superimposing measuring light having traversed the measuring optics with some suitable other light. The suitable other light may comprise a reference light having not traversed the measuring optics. A Fizeau interferometer, a Mach-Zehnder interferometer and a Twyman-Green interferometer are examples of interferometers using reference light which has bypassed the measuring optics. The suitable other light may also comprise a reference light having traversed the measuring optics. A point diffraction interferometer and a shearing interferometer are examples of an interferometer apparatus using reference light having traversed the measuring optics.

An apparatus for determining a refractive index of a fluid is also described, the apparatus comprising an illumination optics for illuminating an object plane with measuring light; an imaging optics configured to image the object plane into an image plane using the measuring light; an analyzing optics for detecting measuring light having traversed the image plane; wherein the imaging optics comprises at least three optical elements, wherein a first optical element is provided by a first containment wall of a fluid containment receiving the fluid, a second optical element is provided by a second containment wall of the fluid containment, and a third optical element is provided by the fluid contained in a space between the first containment wall and the second containment wall.

The inventors found that methods analyzing image aberrations are very sensitive to changes of an optical performance of an imaging optics, and that the refractive index of a fluid may be determined with a high accuracy if the fluid forms part of the imaging optics.

According to an exemplary embodiment, a first pattern is disposed in the object plane of the imaging optics, wherein the first pattern is imaged into the image plane of the imaging optics. An analysis of the image of the first pattern generated by the imaging optics allows to determine corresponding image aberrations, and changes in the refractive index of the fluid may be determined from changes of the image aberrations.

The analysis of the imaged first pattern may comprise forming a Moiré pattern by superimposing the image of the first pattern with a second pattern disposed in the image plane.

The analysis may also comprise generating an interference pattern from the light having traversed the image plane.

BRIEF DESCRIPTION OF THE DRAWINGS

In the following, exemplary embodiments of the present invention are explained in further details with reference to the figures, wherein

FIG. 4a,

DETAILED DESCRIPTION OF EXEMPLARY EMBODIMENTS

Figure 1:
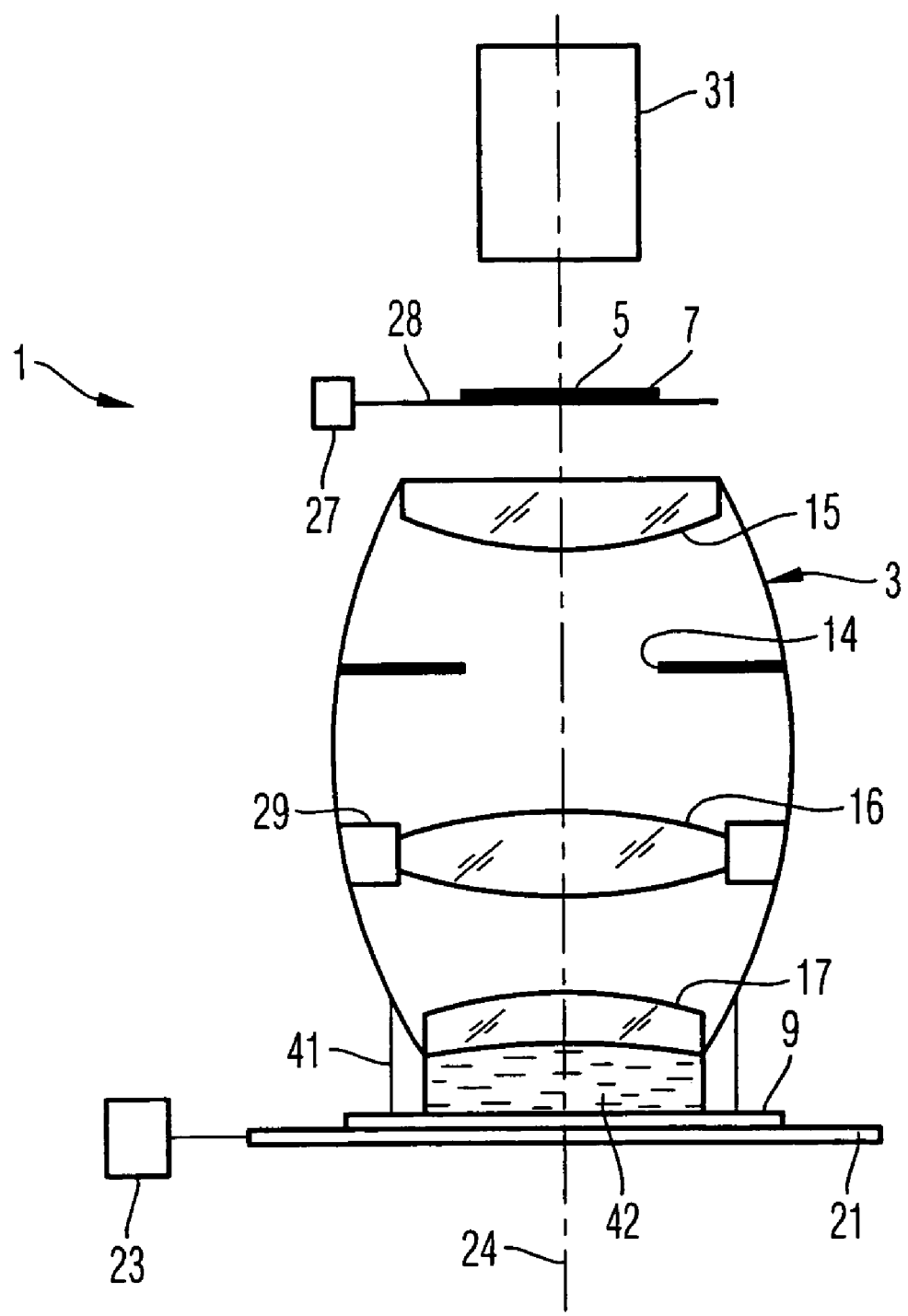
FIG. 1 is a schematic representation of a projection exposure system which may be used in an exemplary embodiment of a lithographic method according to the present invention.

In the exemplary embodiments described below, components that are similar in function and structure are designated as far as possible by similar reference numerals. Therefore, to understand the features of the individual components of a specific embodiment, the descriptions of other embodiments and of the summary of the invention should be referred to.

FIG. 1 schematically illustrates a projection exposure system 1. The projection exposure system 1 comprises a projection optical system 3 for imaging a patterning structure 5 provided on a reticle 7 onto a wafer 9. The patterning structure 5 is disposed in an object plane of the projection optical system 3, and a surface of the wafer 9 is disposed in an image plane of the projection optical system 3.

FIG. 1 shows a very schematic representation of the projection optical system 3 by indicating only three lenses 15, 16 and 17 and an aperture stop 14. The projection optical system 3 is of a liquid-immersion type wherein an immersion liquid is disposed in a space between the surface of the wafer 9 and front lens 17 of the projection optical system 3. Details of an example of the liquid immersion-type projection optical system are disclosed in the WO 2003/077037 A1 and US 2004/0165159 A1, which documents are incorporated herein by reference.

The imaging optics 3 may comprise plural actuators for displacing optical elements of the optics relative to other optical elements. FIG. 1 shows one representative actuator 29, such as a piezoelectric actuator, for adjusting a position of lens 16 relative to the other lenses 15, 17 of the imaging optics 3.

The wafer is covered with a resist-layer which is developed after exposure with the image of the patterning structure 5. The wafer 9 is mounted on a wafer stage 21. An actuator 23 is provided for positioning the wafer 9 relative to the projection optical system 3. In particular, the actuator 23 comprises an actuator for changing a focal state of the imaging by changing a distance of the wafer 9 from the front lens 17 in a direction along an optical axis 24 of the projection optical system 3, and actuators for translating the wafer 9 in directions transverse to the optical axis 24 for changing the field of exposure on the wafer. For example, the exposure of the wafer 9 may be performed according to a stepping or scanning process.

The actuator 23 may further comprise an actuator for changing a tilt of the wafer 9 relative to the optical axis 24.

Similarly, the reticle 7 is mounted on a reticle stage 28 having actuators 27 associated therewith for positioning the reticle 7 relative to the imaging optics 3.

The exposure of the wafer 9 is performed with imaging light generated by an illumination optical system 31 which is schematically illustrated in FIG. 1. The illumination optical system 31 may comprise an imaging light source, such as an excimer laser, for example, a KrF excimer laser emitting light of a wavelength of 248 nanometers. The illumination optical system 31 may further comprise optical elements, such as a beam expander, a diffractive optical element (DOE), objective lens arrangements, an optical integrator and a reticle mask and a mirror. The illumination optical system may be of a conventional type, such as those known from U.S. Pat. No. 6,285,443 B1, U.S. Pat. No. 5,926,257 and U.S. Pat. No. 5,710,620, the contents of which are incorporated herein by reference.

Figure 2:
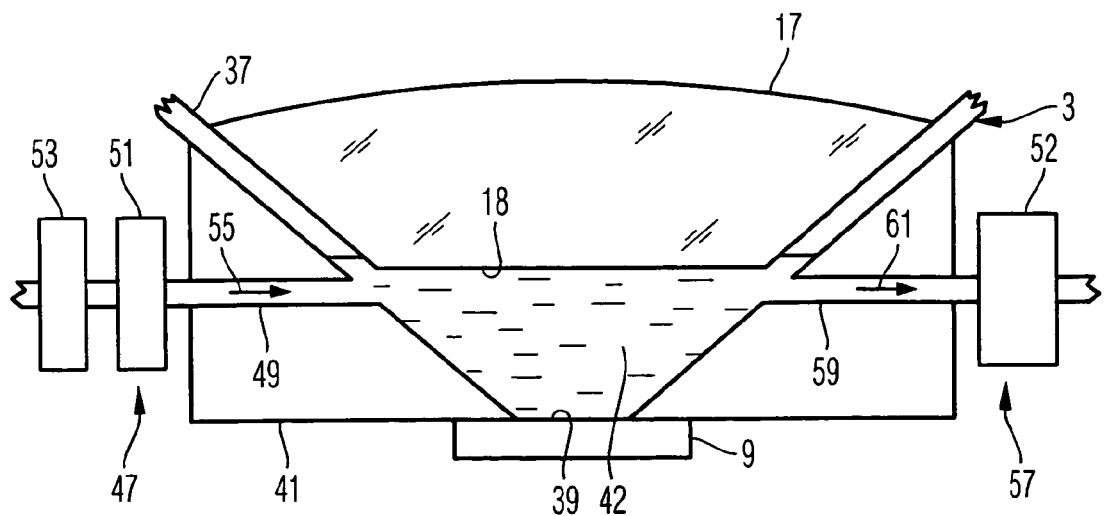
FIG. 2 is a schematic representation of a detail of FIG. 1.

FIG. 2 shows a detail of the projection exposure system 1 shown in FIG. 1. A space between the front lens 17 of the imaging optics 3 and the wafer 9 is defined by a front surface 18 of lens 17, a portion of a mounting structure 37 of the imaging optics 3, a resist carrying surface 39 of the wafer 9 and a confining sealing structure 41. An immersion liquid 42 is disposed in the space between front lens 17 and wafer 9. The immersion liquid 42 is supplied to the space through a supply system 47 comprising a supply pipe 49, a measuring system 51 and a temperature control system 53. During operation of the projection exposure system 1, a continuous flow of immersion liquid into the space between the front lens 17 and the wafer 9 is maintained through the pipe 49 as indicated by arrow 55. A liquid exhaust system 57 comprising a pipe 59 and a measuring system 52 is provided for allowing an excess of immersion liquid supplied to the space between the front lens and the wafer to flow away from that space as indicated by arrow 61 in FIG. 2. It is also possible to provide an intermittent flow of the immersion liquid to and from the space rather than a continuous flow. Thus, the immersion liquid disposed in the space may be substantially stationary during one or more exposure steps, and an exchange of a portion of the liquid may take place in-between subsequent exposure steps.

Figure 3:
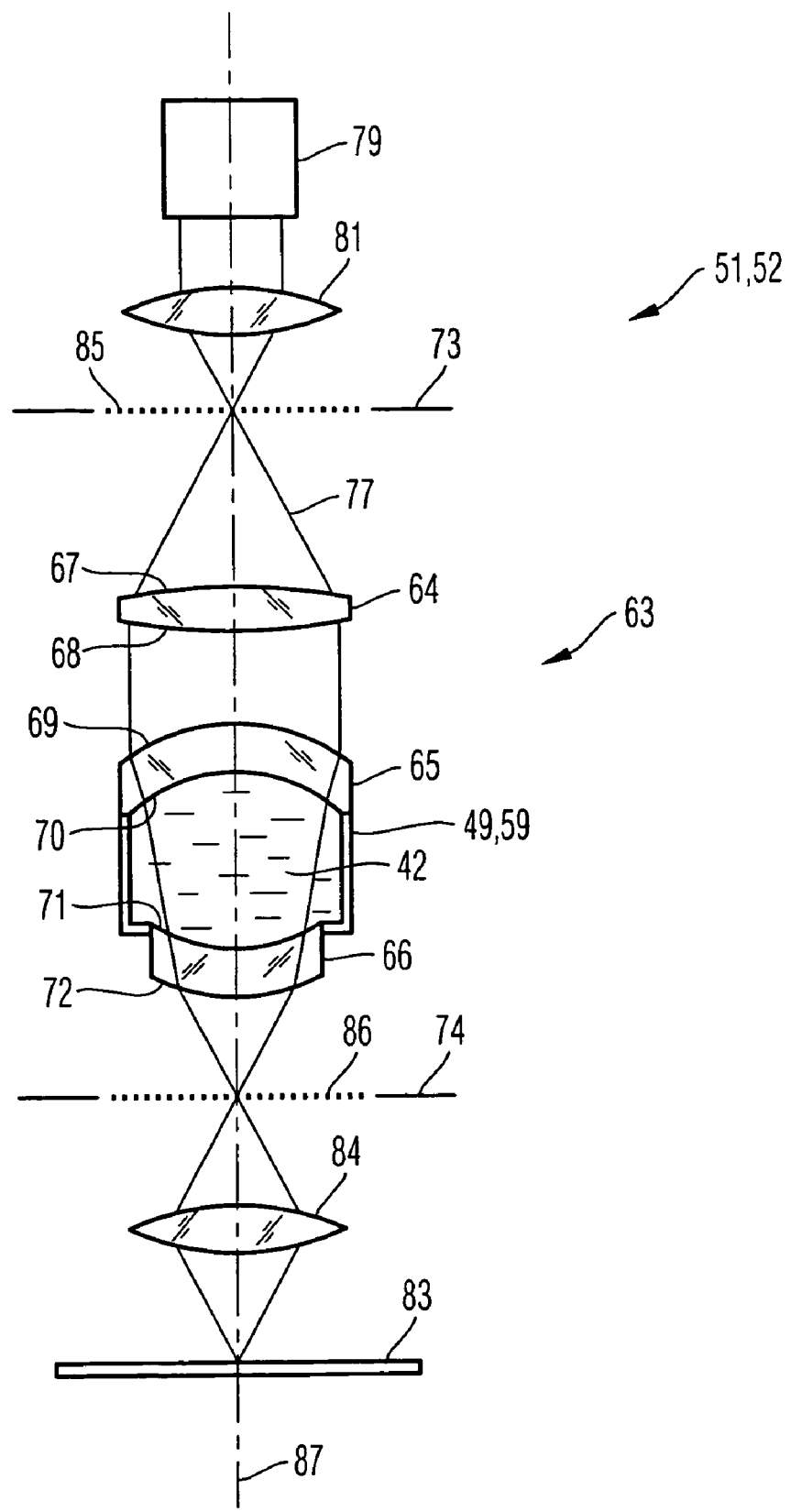
FIG. 3 is a schematic representation of an arrangement for measuring the physical property indicative of the refractive index of an immersion liquid used in the system shown in FIG. 1.

The measuring system 51, 52 is illustrated in FIG. 3. The measuring system 51, 52 comprises a measuring optics 63 comprising three lenses 64, 65, 66 having successive optical surfaces 67 to 72, wherein lenses 65 and 66 form respective portions of the liquid supply pipes 49, 59 such that immersion liquid 42 is confined in a space between surfaces 70 and 71 and contributes to an imaging performance of measuring optics 63. Optical data of the imaging optics 63 are illustrated in Table 1 below.

TABLE 1

| Lens | Radius | Thickness | Aperture Radius | Glass |
| --- | --- | --- | --- | --- |
| 73 | — | 7.000000 | 4.3644e−21 | Air |
| 67 | 10.000000 | 2.000000 | 3.000000 | Silica |
| 68 | −10.000000 | 2.000000 | 3.395133 | Air |
|  | — | 2.000000 | 5.000000 | Air |
| 69 | 6.000000 | 2.000000 | 3.695554 | Silica |
| 70 | 4.000000 | 8.000000 | 3.349534 | Water |
| 71 | −4.000000 | 2.000000 | 2.422646 | Silica |
| 72 | −6.000000 | — | 2.305222 | Silica |
| 74 | — | 7.513094 | 2.305222 | Air |

Measuring optics 63 has an object plane 73 which is imaged into an image plane 74 by a beam of measuring light 77 generated and collimated by a laser light source 79 and collimator 81, respectively. The measuring light traversing the image plane 74 is imaged onto a CCD image detector 83 using a camera optics 84. An object pattern 85 indicated by a line of dots is disposed in the object plane 73, and an analyzing pattern 86 indicated by a line of dots is disposed in a region of the image plane 74.

Figure 4A:
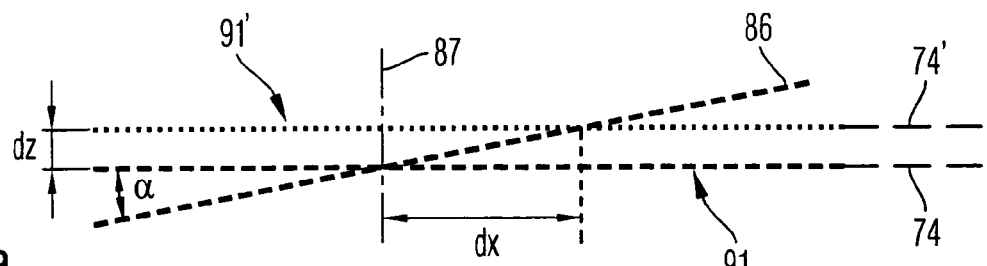
Figure 4B:
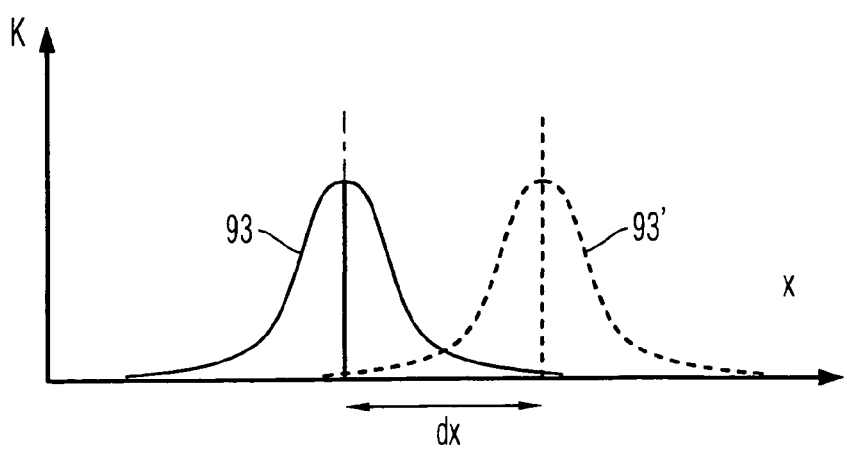
FIG. 4b illustrate details of the arrangement shown in FIG. 3.

FIG. 4a is a detailed illustration of the analyzing pattern 86 disposed in a region of the image plane 74 of measuring optics 63. The analyzing pattern 86 is oriented under an angle α with respect to the image plane 74. Reference numeral 91 indicates the image of the object pattern 85 generated by the measuring optics 63 when the refractive index of the immersion liquid, which is water, has a value $n_0=1.4366$ at a wavelength of the laser light source 79 of 193 nm. The projected object pattern 91 and the analyzing pattern 86 are substantially identical patterns such that a superimposed combined pattern of component patterns 86 and 91 detected by detector 83 is a Moiré pattern. A line 93 shown in FIG. 4b indicates an intensity of the Moiré pattern detected by detector 83. When the refractive index of the immersion liquid 42 disposed in the measuring optics 63 is changed to a value $n_0+dn$, the projected reference pattern is formed as an image in a plane 74' which is displaced from the image plane 74 by a distance dz. Such displacement of the projected image pattern 91' by an amount dz in the direction along the optical axis 87 results in a lateral shift dx of the Moiré pattern as indicated by dotted line 93' in FIG. 4b. The lateral displacement dx is, due to the small tilt angle α of the analyzing pattern 86, significantly larger than the displacement dz of the image plane 74 due to the change in the refractive index of the immersion liquid. Thus, the measuring system 51, 52 is highly sensitive to changes of the refractive index of the immersion liquid supplied through the measuring systems 51, 52. In practice, a relative accuracy of measuring the refractive index of the immersion liquid may be better than $10^{-6}$.

Based on the detected changes of the refractive index of the immersion liquid supplied to the space between the front lens 17 and the wafer 9, as detected by measuring system 52, an optical property of the projection exposure system 1 is adjusted with a goal to maintain an imaging quality of the projection exposure system. The adjusted optical property may comprise a displacement of the imaging pattern 7 in a direction of the optical axis 24 of the projection exposure system, which displacement is effected by actuator 27. The adjusted optical property may further comprise a position of the lens 16 relative to the other lenses 15, 17 of the imaging optics 3, which position is controlled by actuator 29. The adjusted optical property may further comprise a position of the wafer 9 along the optical axis 24, which position is controlled actuator 23.

Further, the adjusted optical property may be the refractive index of the immersion liquid disposed in the space between the front lens 17 and the wafer 9. The refractive index of the immersion liquid may be adjusted by controlling a temperature of the immersion liquid supplied to the space between the front lens 17 and the wafer 39, which temperature is controlled by temperature control unit 53 which is configured to heat and/or cool the immersion liquid flowing therethrough.

Figure 5:
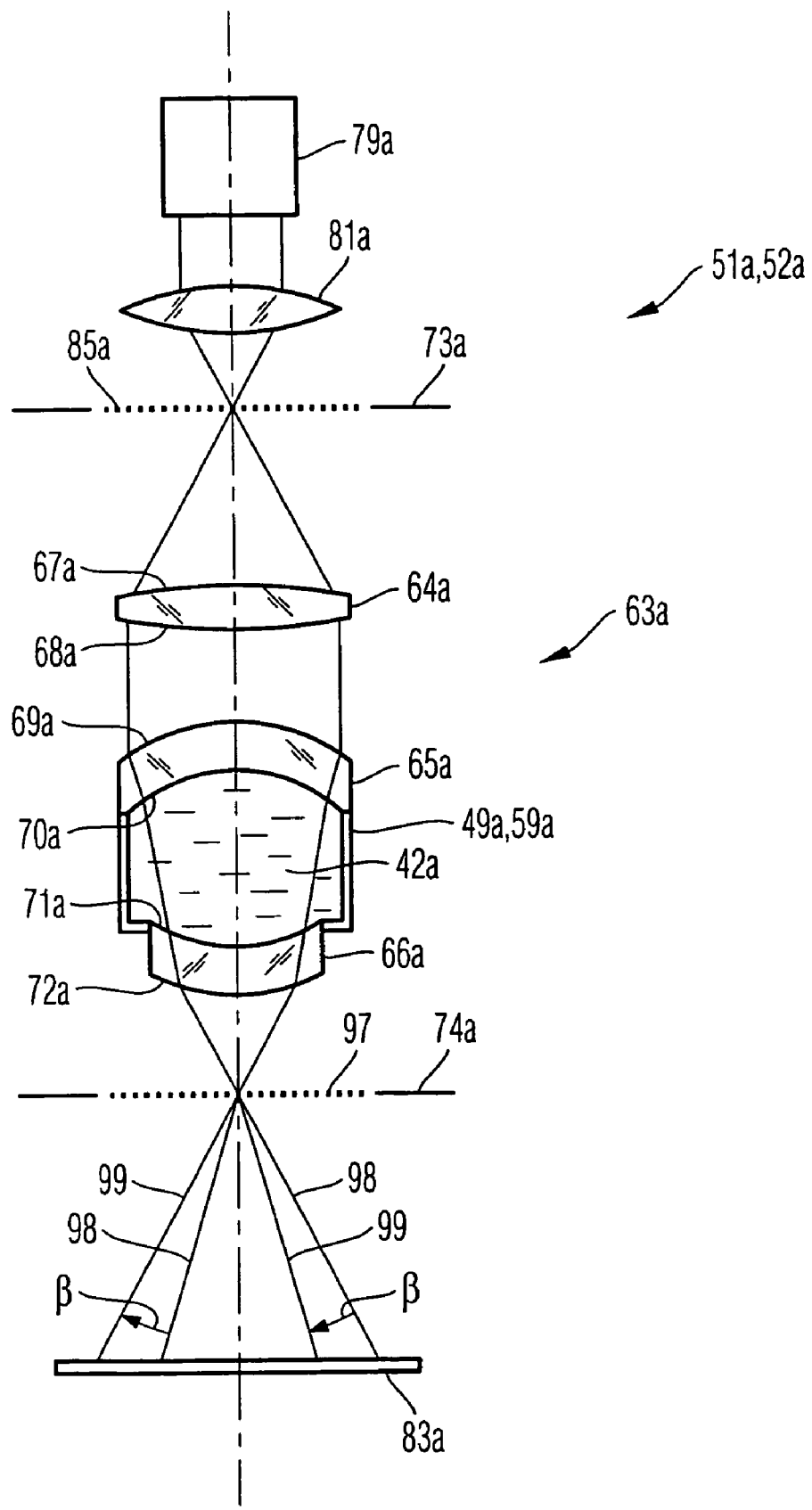
FIG. 5 is a schematic representation of a further arrangement for measuring the physical property indicative of the refractive index of the immersion liquid used in the system shown in FIG. 1.

FIG. 5 illustrates a further example of a measuring system 51a, 52a for detecting a physical property which is indicative of the refractive index of the immersion liquid.

The measuring system 51a, 52a has a similar configuration as the measuring system shown in FIG. 3. In the example of the measuring system shown in FIG. 5, a measuring optics 63a has a same configuration as that shown in FIG. 3 and indicated in Table 1. An reference pattern 85a is disposed in an object plane 73a of the measuring optics 63a, and a diffraction grating 97 is disposed in an image plane 74a of the measuring optics 63a. The diffracting grating 97 allows a $0^{th}$ order diffracted beam of measuring light to traverse the grating without deflection, as indicated by rays 98, and a first order diffracted beam of measuring light is deflected by the grating 97 by an angle ±β, wherein only one of the first order diffracted beams is indicated by rays 99 in FIG. 5. Thus, the $0^{th}$ order and the plus/minus first order diffracted beams 98, 99 generate an interference pattern formed on detector 83a. Such method of generating interference patterns from a beam of light is known in the art as shearing interferometry.

A change of the refractive index of the immersion liquid 42a flowing through the measuring optics 63a will generate aberrations of the imaging of the reference pattern 85a disposed in the object plane 73a into the image plane 74a. Such aberrations may be determined by analyzing the generated interference patterns detected by detector 83a. The aberrations of the imaging and derived from the interference patterns may be approximated by Zernike polynomials. Background information with respect to interferogram evaluation using Zernike polynomials may be obtained from chapter 13 of the textbook of Daniel Malacara "Optical Shop Testing", $2^{nd}$ Edition, John Wiley & Sons, Inc., 1992. For instance, a Zernike coefficient $U_{10}$ according to the nomenclature used in the textbook of Malacara may be derived from the evaluated interferograms. The Zernike coefficient $U_{10}$ represents a defocus of the measuring optics, and the defocus of the measuring optics 63a is the physical property which is determined by the measuring systems 51, 52 and which is indicative of the refractive index of the immersion fluid.

Figure 6:
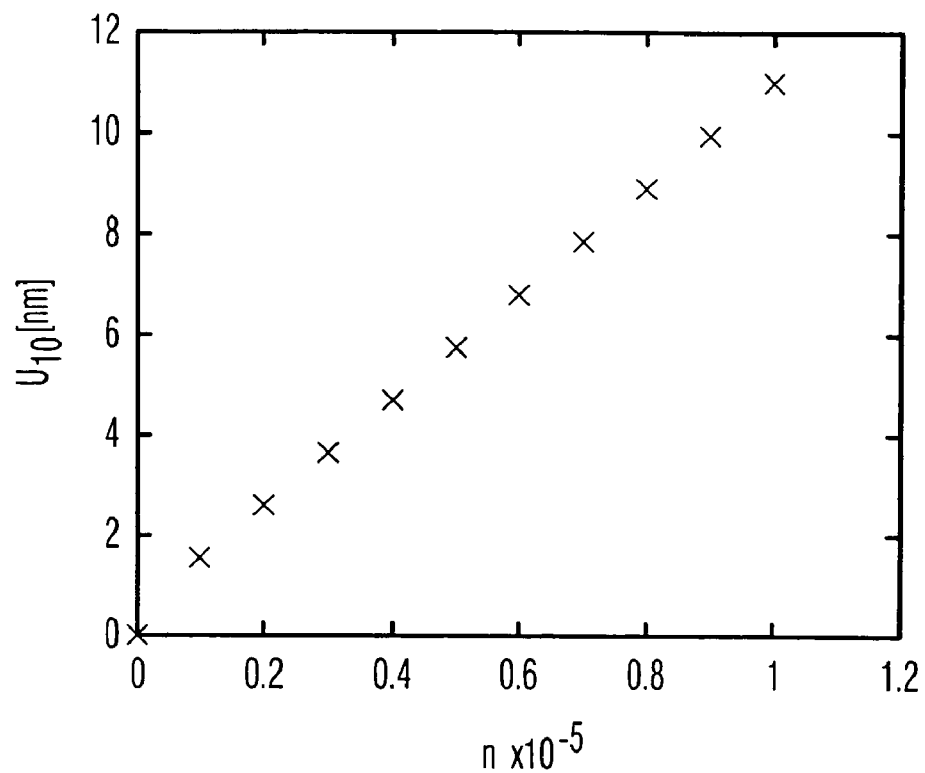
FIG. 6 is a representation of measuring results obtainable with the arrangement shown in FIG. 5.

FIG. 6 shows a dependency of the determined Zernike coefficient $U_{10}$ from a variation of the refractive index n of the immersion liquid flowing through the measuring optics 63a. In practice, the Zernike coefficient $U_{10}$ may be determined with an accuracy of 2 nanometer, such that an obtainable measuring accuracy of changes in the refractive index n is better than $10^{-6}$.

Figure 7:
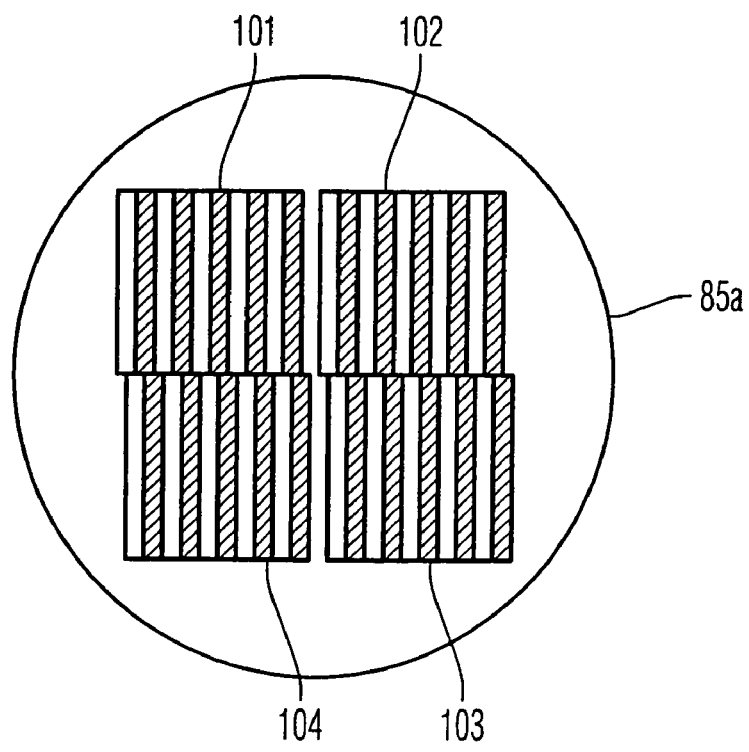
FIG. 7 is an example of a pattern which may be used in the arrangement shown in FIG. 5.

FIG. 7 is a representation of reference pattern 85a disposed in the object plane 73a of the measuring optics 63a. Reference pattern 85a is a combined pattern of four pattern portions 101, 102, 103, 104. The four adjacent patterns 101, 102, 103, 104 are imaged into the image plane 74a and result in four different interference patterns generated in four adjacent corresponding portions of detector 83a. The four reference patterns 101, 102, 103, 104 are designed such that the resulting interference patterns generated on the detector are substantially identical patterns which show a phase shift of 90° relative to each other. Thus, phase shifted interference patterns are simultaneously generated on the detector 83a, allowing for an increased accuracy in evaluation of the interference patterns according to a phase shifting interferometry which is also well-known in the art of interferogram evaluation. Background information relating to phase shifting interferometry may be obtained from sections 14.1 to 14.8 of the above mentioned textbook of Daniel Malacara.

The refractive index of the immersion liquid is the physical parameter of the immersion liquid which is measured in the above illustrated embodiments. It is, however, possible to perform measurements of other physical properties of the immersion liquid with the intention to improve the optical performance of the projection exposure system based on a measuring result. Examples of such other physical properties of the immersion liquid are: a density of the immersion liquid, a dispersion of the immersion liquid, a viscosity of the immersion liquid, a temperature of the immersion liquid, a contamination of the immersion liquid with at least one impurity, a hydrogen ion concentration in the immersion liquid, a gas concentration in the immersion liquid, a gas bubble concentration in the immersion liquid.

After exposure of the resist covering the substrate or wafer with the image of the patterning structure, the substrate is further processed by lithographic steps such as post-exposure bake (PEB) of the resist, development of the resist, a hart bake and measurement and inspection of the imaged features. Further lithographic steps for processing the substrate may comprise etching, ion implantation, doping, metallization, oxidation, chemo-mechanical polishing and others, for forming layers of structured features of the miniaturized devices to be formed on a substrate. Thereafter, the devices are separated from one another by a technique such as dicing or sawing, and the individual devices may be mounted on a carrier connected to pins etc.

Summarized, a lithographic method of manufacturing a miniaturized device using a projection exposure system of the liquid immersion type comprises disposing a patterning structure to be imaged in a region of an object plane of an imaging optics of the projection exposure system; disposing a substrate carrying a resist in a region of an image plane of the imaging optics and exposing portions of the substrate with images of the patterning structure using the projection exposure system; maintaining a flow of an immersion liquid to and from a space between the substrate and a front lens of the imaging optics closest to the substrate; measuring a physical property which is indicative of at least one of a refractive index of the immersion liquid and a change of the refractive index of the immersion liquid over time, wherein the physical property is measured using a beam of measuring light interacting with the immersion liquid; adjusting at least one optical property of the projection exposure system based on the measured physical property; exposing further portions of the substrate with images of the patterning structure using the projection exposure system with the at least one adjusted optical property of the projection exposure system; and developing the exposed resist and processing the substrate with the developed resist.

While the invention has been described also with respect to certain specific embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A lithographic method of manufacturing a miniaturized device using a projection exposure system of the liquid immersion type, the method comprising:
   disposing a patterning structure to be imaged in a region of an object plane of an imaging optics of the projection exposure system;
   disposing a substrate carrying a resist in a region of an image plane of the imaging optics and exposing portions of the substrate with images of the patterning structure using the projection exposure system;
   maintaining, at least during selected time intervals, a flow of an immersion liquid to and from a space between the substrate and a front lens of the imaging optics closest to the substrate;
   measuring a physical property which is indicative of at least one of a refractive index of the immersion liquid and a change of the refractive index of the immersion liquid over time, wherein the physical property is measured using a beam of measuring light interacting with the immersion liquid;
   measuring a first physical property using a first beam of measuring light interacting with the immersion liquid at a location upstream of the space between the substrate and the front lens;
   measuring a second physical property using a second beam of measuring light interacting with the immersion liquid at a location downstream of the space between the substrate and the front lens;
   adjusting at least one optical property of the projection exposure system based on the measured physical property, the measured first physical property, and the measured second physical property;
   exposing further portions of the substrate with images of the patterning structure using the projection exposure system with the at least one adjusted optical property of the projection exposure system; and
   developing the exposed resist and processing the substrate with the developed resist.

2. The method according to claim 1, wherein the beam of measuring light interacts with the immersion liquid at a location upstream of the space between the substrate and the front lens.

3. The method according to claim 1, wherein the at least one adjusted optical property of the projection exposure system comprises the refractive index of the immersion liquid in the space between the substrate and the front lens.

4. The method according to claim 3, wherein the refractive index of the immersion liquid in the space between the substrate and the front lens is adjusted by controlling a temperature of the immersion liquid in the space between the substrate and the front lens.

5. The method according to claim 3, wherein the immersion liquid is composed of at least two components, and wherein the refractive index of the immersion liquid in the space between the substrate and the front lens is adjusted by controlling relative amounts of the at least two components in the immersion liquid supplied to the space between the substrate and the front lens.

6. The method according to claim 1, wherein the projection exposure system comprises a first optical element and a second optical element, and wherein the at least one optical property comprises a distance and an orientation of the first optical element relative to the second optical element.

7. The method according to claim 6, wherein the first and second optical elements are selected from a group comprising a refractive lens and a mirror.

8. The method according to claim 1, wherein the at least one optical property comprises a shape of a surface of an optical element of the projection exposure system.

9. The method according to claim 1, wherein the at least one adjusted optical property of the projection exposure system comprises the refractive index of the immersion liquid in the space between the substrate and the front lens.

10. The method according to claim 1, wherein the projection exposure system comprises a first optical element and a second optical element, and wherein the at least one optical property comprises a distance and an orientation of the first optical element relative to the second optical element.

11. A lithographic method of manufacturing a miniaturized device using a projection exposure system of the liquid immersion type, the method comprising:
    disposing a patterning structure to be imaged in a region of an object plane of an imaging optics of the projection exposure system;
    disposing a substrate carrying a resist in a region of an image plane of the imaging optics and exposing portions of the substrate with images of the patterning structure using the projection exposure system;

maintaining, at least during selected time intervals, a flow of an immersion liquid to and from a space between the substrate and a front lens of the imaging optics closest to the substrate wherein the immersion liquid is supplied through a tube forming a portion of a measuring optics;

measuring a physical property which is indicative of at least one of a refractive index of the immersion liquid and a change of the refractive index of the immersion liquid over time, wherein the physical property is measured using a beam of measuring light interacting with the immersion liquid, wherein the beam of measuring light traverses the measuring optics, a reference pattern is disposed in an object plane of the measuring optics, and a projected pattern generated by the beam of measuring light downstream of the measuring optics is analyzed for determining the physical property;

adjusting at least one optical property of the projection exposure system based on the measured physical property;

exposing further portions of the substrate with images of the patterning structure using the projection exposure system with the at least one adjusted optical property of the projection exposure system; and developing the exposed resist and processing the substrate with the developed resist.

12. The method according to claim 11, wherein the analyzing of the projected pattern comprises superimposing the projected pattern with an analyzing pattern and analyzing the superimposed pattern.

13. The method according to claim 11, wherein the at least one adjusted optical property of the projection exposure system comprises the refractive index of the immersion liquid in the space between the substrate and the front lens.

14. The method according to claim 11, wherein the projection exposure system comprises a first optical element and a second optical element, and wherein the at least one optical property comprises a distance and an orientation of the first optical element relative to the second optical element.

15. The method according to claim 11, wherein the determining of the physical property further comprises superimposing a first portion of light of the beam of measuring light having traversed the measuring optics with a second portion of light, and analyzing an interference pattern generated by the superimposed first portion of light and the second portion of light.

16. The method according to claim 15, wherein the second portion of light is a portion of the measuring light having traversed the measuring optics.

17. The method according to claim 16, wherein the interference pattern is formed by an interferometer apparatus comprising a point diffraction interferometer and a shearing interferometer.

18. The method according to claim 15, wherein the second portion of light is a portion of the measuring light having bypassed the measuring optics.

19. The method according to claim 18, wherein the interference pattern is formed by an interferometer apparatus comprising a Twyman-Green interferometer, a Mach-Zehnder interferometer and a Fizeau interferometer and a shearing interferometer.

20. The method according to claim 15, wherein the at least one adjusted optical property of the projection exposure system comprises the refractive index of the immersion liquid in the space between the substrate and the front lens.

21. The method according to claim 15, wherein the projection exposure system comprises a first optical element and a second optical element, and wherein the at least one optical property comprises a distance and an orientation of the first optical element relative to the second optical element.

* * * * *